United States Patent
Lee et al.

(10) Patent No.: US 10,700,062 B2
(45) Date of Patent: Jun. 30, 2020

(54) VERTICAL TRANSPORT FIELD-EFFECT TRANSISTORS WITH UNIFORM THRESHOLD VOLTAGE

(71) Applicant: International Business Machines Corporation, Armonk, NY (US)

(72) Inventors: ChoongHyun Lee, Rensselaer, NY (US); Kangguo Cheng, Schenectady, NY (US); Juntao Li, Cohoes, NY (US); Shogo Mochizuki, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/158,449

(22) Filed: Oct. 12, 2018

(65) Prior Publication Data

US 2020/0119010 A1 Apr. 16, 2020

(51) Int. Cl.
*H01L 29/66* (2006.01)
*H01L 27/088* (2006.01)
(Continued)

(52) U.S. Cl.
CPC ...... *H01L 27/088* (2013.01); *H01L 21/28088* (2013.01); *H01L 21/28132* (2013.01);
(Continued)

(58) Field of Classification Search
CPC ..... H01L 21/823431; H01L 21/823821; H01L 21/823437; H01L 21/823878; H01L 29/66795–66818; H01L 29/785–7856; H01L 29/42392; H01L 29/7827; H01L 2029/7857–7858; H01L 27/0886;
(Continued)

(56) References Cited

U.S. PATENT DOCUMENTS

| 6,773,994 B2 | 8/2004 | Chittipeddi et al. |
| 9,269,629 B2 | 2/2016 | Cheng et al. |

(Continued)

OTHER PUBLICATIONS

U.S. Appl. No. 15/862,930 filed in the name of Choonghyun Lee et al. dated Jan. 5, 2018 and entitled "Replacement Metal Gate Processes for Vertical Transport Field-Effect Transistor."

*Primary Examiner* — Eric A. Ward
*Assistant Examiner* — Eric K Ashbahian
(74) *Attorney, Agent, or Firm* — Vazken Alexanian; Ryan, Mason & Lewis, LLP

(57) ABSTRACT

A semiconductor structure includes a substrate, a plurality of fins disposed over a top surface of the substrate, and a gate stack surrounding a portion of sidewalls of the plurality of fins. The plurality of fins include two or more active device fins comprising a semiconducting material providing vertical transport channels for respective vertical transport field-effect transistors, and two or more edge fins surrounding the two or more active device fins, the two or more edge fins comprising a dielectric material. Thicknesses of one or more layers of the gate stack surrounding the portion of the sidewalls of the two or more edge fins are different than thicknesses of the one or more layers of the gate stack surrounding the portion of the sidewalls of the active device fins. The vertical transport field-effect transistors provided by the active device fins have uniform threshold voltage.

13 Claims, 14 Drawing Sheets

(51) Int. Cl.
*H01L 29/78* (2006.01)
*H01L 29/49* (2006.01)
*H01L 29/08* (2006.01)
*H01L 21/8234* (2006.01)
*H01L 29/06* (2006.01)
*H01L 21/28* (2006.01)

(52) U.S. Cl.
CPC ........... *H01L 21/823468* (2013.01); *H01L 21/823481* (2013.01); *H01L 21/823487* (2013.01); *H01L 29/0665* (2013.01); *H01L 29/0847* (2013.01); *H01L 29/4966* (2013.01); *H01L 29/66545* (2013.01); *H01L 29/66666* (2013.01); *H01L 29/66712* (2013.01); *H01L 29/7827* (2013.01)

(58) Field of Classification Search
CPC ......... H01L 29/66666; H01L 29/78642; H01L 29/66712; H01L 27/088; H01L 27/2454; H01L 21/823468; H01L 21/28088; H01L 21/28132; H01L 21/823885
See application file for complete search history.

(56) References Cited

U.S. PATENT DOCUMENTS

| | | | |
|---|---|---|---|
| 9,306,063 | B2 | 4/2016 | Doyle et al. |
| 9,502,265 | B1 | 11/2016 | Jiang et al. |
| 9,659,930 | B1 | 5/2017 | Yu et al. |
| 9,704,990 | B1 | 7/2017 | Mochizuki et al. |
| 9,728,466 | B1 * | 8/2017 | Mallela ........... H01L 21/823814 |
| 9,768,072 | B1 | 9/2017 | Cheng |
| 9,773,708 | B1 | 9/2017 | Zhang et al. |
| 9,773,901 | B1 * | 9/2017 | Gluschenkov ...... H01L 29/7827 |
| 9,780,208 | B1 | 10/2017 | Xie et al. |
| 9,799,570 | B1 | 10/2017 | Cheng |
| 9,806,191 | B1 * | 10/2017 | He .................... H01L 29/42392 |
| 9,929,256 | B2 | 3/2018 | Cheng et al. |
| 9,941,279 | B2 | 4/2018 | Ching et al. |
| 2016/0163603 | A1 * | 6/2016 | Bao ................. H01L 21/823842 257/412 |
| 2016/0293756 | A1 * | 10/2016 | Liu ..................... H01L 29/7827 |
| 2017/0338225 | A1 * | 11/2017 | Ching ................ H01L 27/0886 |
| 2018/0012969 | A1 | 1/2018 | Cheng et al. |
| 2018/0151561 | A1 * | 5/2018 | Cantoro ............... H01L 27/088 |
| 2019/0088555 | A1 * | 3/2019 | Xie ................. H01L 21/823842 |

* cited by examiner

US 10,700,062 B2

VERTICAL TRANSPORT FIELD-EFFECT TRANSISTORS WITH UNIFORM THRESHOLD VOLTAGE

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming vertical transport field-effect transistors with uniform threshold voltage.

In one embodiment, a semiconductor structure comprises a substrate, a plurality of fins disposed over a top surface of the substrate, and a gate stack surrounding a portion of sidewalls of the plurality of fins. The plurality of fins comprises two or more active device fins comprising a semiconducting material providing vertical transport channels for respective vertical transport field-effect transistors, and two or more edge fins surrounding the two or more active device fins, the two or more edge fins comprising a dielectric material. Thicknesses of one or more layers of the gate stack surrounding the portion of the sidewalls of the two or more edge fins are different than thicknesses of the one or more layers of the gate stack surrounding the portion of the sidewalls of the active device fins.

In another embodiment, an integrated circuit comprises two or more vertical transport field-effect transistors comprising a substrate, a plurality of fins disposed over a top surface of the substrate, and a gate stack surrounding a portion of sidewalls of the plurality of fins. The plurality of fins comprises two or more active device fins comprising a semiconducting material providing vertical transport channels for respective ones of the two or more vertical transport field-effect transistors, and two or more edge fins surrounding the two or more active device fins, the two or more edge fins comprising a dielectric material. Thicknesses of one or more layers of the gate stack surrounding the portion of the sidewalls of the two or more edge fins are different than thicknesses of the one or more layers of the gate stack surrounding the portion of the sidewalls of the active device fins.

In another embodiment, a method of forming a semiconductor structure comprises forming a plurality of fins disposed over a top surface of a substrate, the plurality of fins comprising two or more edge fins surrounding two or more interior fins, the plurality of fins comprising a semiconducting material, replacing the semiconducting material of the two or more edge fins with a dielectric material, and forming a gate stack surrounding a portion of sidewalls of the plurality of fins. The two or more interior fins comprise active device fins providing vertical transport channels for respective ones of two or more vertical transport field-effect transistors. Thicknesses of one or more layers of the gate stack surrounding the portion of the sidewalls of the two or more edge fins are different than thicknesses of the one or more layers of the gate stack surrounding the portion of the sidewalls of the active device fins.

DETAILED DESCRIPTION

Figure 1:
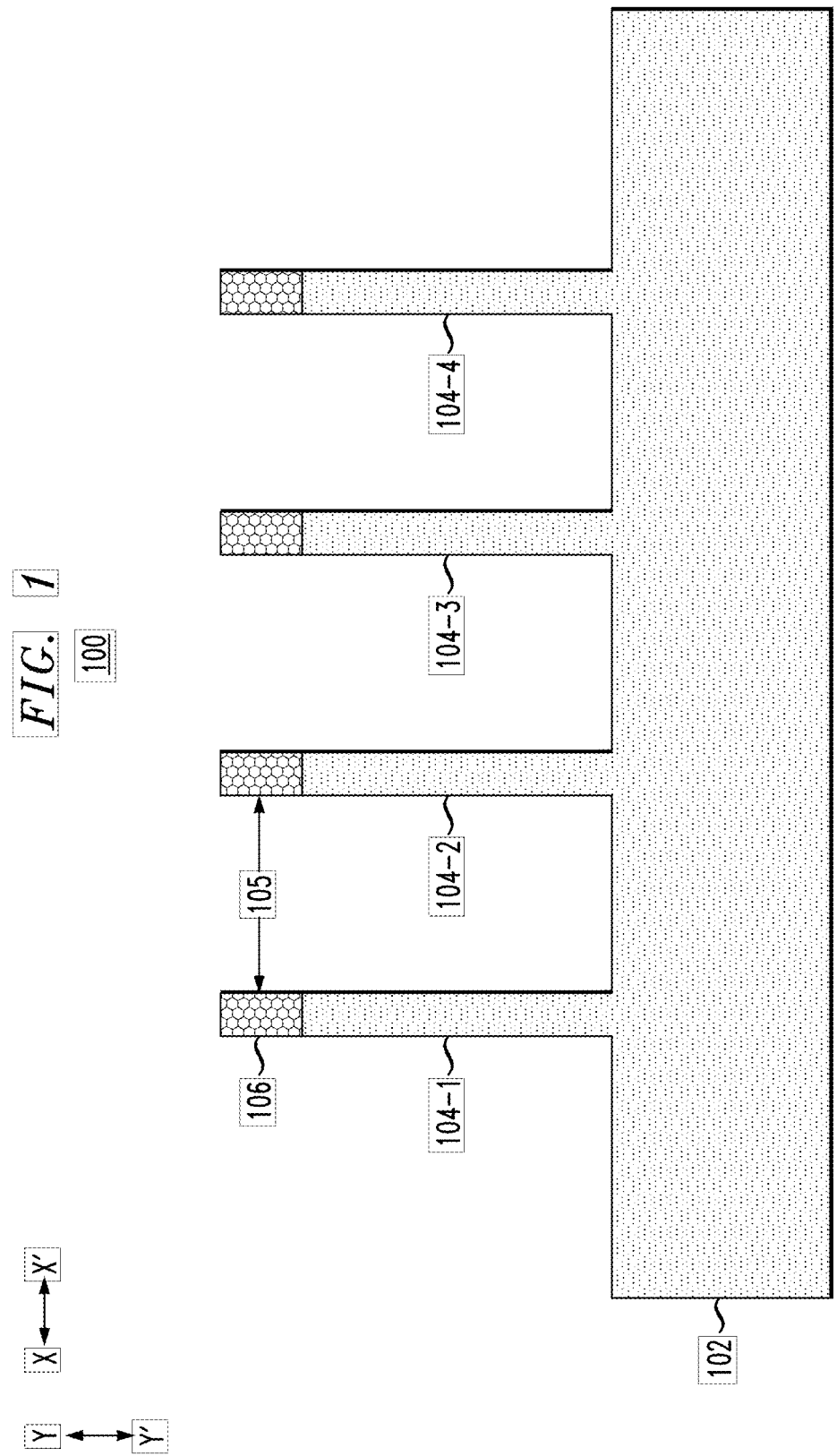
FIG. 1 depicts a cross-sectional view of fins formed over a substrate, according to an embodiment of the invention.

Illustrative embodiments of the invention may be described herein in the context of illustrative methods for forming vertical transport field-effect transistors with uniform threshold voltage, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Vertical transport FETs (VTFETs) are being pursued as viable CMOS architectures for scaling to 7 nanometers (nm) and beyond. VTFETs provide the opportunity for further device scaling compared with other device architectures. Processes for forming VTFETs, however, may have strict constraints on thermal budgets for certain downstream processing steps such as top source/drain epitaxial growth and dopant activation anneal when the high-k metal gate module is formed earlier in the process. High temperature processes (e.g., at temperatures above 550° C.) for the top source/drain region can cause undesired threshold voltage (Vt) shift, increase in inversion layer thickness (Tinv), and gate leakage current (Toxgl) degradation due to oxygen and metal diffusion into the channel. Embodiments provide improved processes for forming VTFETs with replacement metal gate (RMG) processes wherein a dummy gate is formed vertically first followed by the top junction or top source/drain regions, followed by a dummy gate pull.

VTFETs have various potential advantages over other conventional structures such as fin field-effect transistors (FinFETs). Such advantages may include improvements in density, performance, power consumption, and integration. One important advantages for VTFETs is in gate pitch scalability. RMG schemes for VTFET structures provide a viable solution to overcome process-related challenges, such as the low thermal budget for top source/drain epitaxial growth and dopant driving anneal processes, and in channel length variation. One drawback, however, is that there may be non-uniform threshold voltage (Vt) distribution along the fins in VTFETs with aggressive scaled fin or gate pitch. The non-uniform Vt distribution is caused, in part, due to the variation of the work function metal (WFM) thickness during the RMG process.

Illustrative embodiments provide techniques for forming VTFETs with uniform Vt in fin arrays with aggressive scaling. To do so, some embodiments replace the edge fins in a fin array with dielectric dummy fins. Advantageously, embodiments resolve issues related to device performance variation in aggressively scaled VTFETs.

As noted above, RMG processes may be used for forming VTFETs. RMG processes, however, can result in a thickness variation in the WFM material across the fins in an array of fins forming VTFETs due to geometry limitations. Thus, VTFETs formed using RMG processes may have non-uniform Vt distribution, particularly when the structure includes many fins.

The Vt in a VTFET device is very sensitive to the thicknesses of the materials in the gate stack. For example, the structure may include a silicon (Si) layer fin, with an interlevel dielectric formed surrounding the fin (e.g., formed of an oxide such as silicon dioxide ($SiO_2$)), followed by a high-k dielectric layer (e.g., formed of hafnium oxide ($HfO_2$)), followed by a gate stack. The gate stack may include a WFM stack, such as a stack including a bottom titanium nitride (TiN) layer, a titanium aluminum carbide (TiAlC) layer, and a top TiN layer. The thickness of the bottom TiN layer may be in the range of 10 angstroms (Å) to 35 Å, and the TiAlC layer may have a thickness in the range of 30 Å to 45 Å. Depending on the thicknesses of the bottom TiN and TiAlC layers, the linear Vt (Vtlin) may vary between 0.1 and 0.55 volts (V). In particular, if the bottom TiN layer thickness is fixed, the TiAlC layer thickness plays an important role in determining the Vt. It should be appreciated that embodiments are not limited solely to WFM stacks of TiN/TiAlC/TiN. As will be described in further detail below, various other types of WFM materials may be used in the WFM stack or more generally the metal gate stack of a VTFET structure.

Illustrative processes for forming VTFET structures with uniform threshold voltages will now be described with respect to FIGS. 1-14.

FIG. 1 shows a cross-sectional view 100, taken across a set of fins 104-1, 104-2, 104-3, 104-4 (collectively, fins 104) formed over a substrate 102. Each of the fins 104 is topped with a hard mask (HM) 106. The fins 104 provide vertical transport channels for VTFETs formed using processes described herein. In some embodiments, different ones of the fins 104 may provide vertical transport channels for different types of VTFETs (e.g., nFETs and pFETs).

The substrate 102 may comprise a semiconductor substrate formed of silicon (Si), although other suitable materials may be used. For example, the substrate 102 can include any suitable substrate structure, e.g., a bulk semiconductor. The substrate 102 can include a silicon-containing material. Illustrative examples of Si-containing materials suitable for the substrate 102 can include, but are not limited to, Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The size of the substrate 102 may vary, such as based on the number of VTFETs that are to be formed thereon. The vertical thickness or height of the substrate (in direction Y-Y') may be in the range of 10 nm to 500 nm, although other heights above or below this range may be used as desired for a particular application.

The fins 104, in some embodiments, are formed of the same material as the substrate 102. The fins 104 may be formed using sidewall image transfer (SIT) or other suitable techniques such as lithography and etching including reactive-ion etching (RIE), etc.

Each of the fins 104 may have a width or horizontal thickness (in direction X-X') in the range of 6 nm to 10 nm, although other widths above or below this range may be used as desired for a particular application. Each of the fins 104 may have a height or vertical thickness (in direction Y-Y') ranging from 30 nm to 200 nm, although other heights above or below this range may be used as desired for a particular application.

In some embodiments, there is a tight fin pitch 105 or spacing between adjacent ones of the fins 104. The fin pitch may be approximately 20 nm, or more generally in the range of 10 nm to 30 nm. It should be appreciated, however, that other spacing may be used as desired for a particular application.

Although not shown in FIG. 1, an interfacial layer may be formed on sidewalls of the fins 104 (e.g., disposed between the fins 104 and a dielectric layer 126 described in further detail below). The interfacial layer may be formed of $SiO_2$ or another suitable material such as silcon oxynitride ($Si$-$O_xN_y$). The interfacial layer may have a width or horizontal thickness (in direction X-X') ranging from 0.5 nm to 1.5 nm, although other widths above or below this range may be used as desired for a particular application.

HM 106 is formed over the tops of each of the fins 104. The HM 106 may be formed of a nitride such as silicon nitride (SiN), although other suitable materials may be used. The HM 106 may have a height or vertical thickness (in direction Y-Y') in the range of 10 nm to 100 nm, although other heights above or below this range may be used as desired for a particular application. The HM 106 may be patterned over an initial substrate, with the resulting substrate 102 being formed by etching in the regions exposed by the HM 106 to form the fins 104 from the initial substrate. The HM 106, in some embodiments, may be formed as a multi-layer, such as a multi-layer of two layers including a nitride and oxide (e.g., $SiN/SiO_2$), a multi-layer of three layers including one or more nitride and one or more oxide layers (e.g., $SiN/SiO_2/SiN$, $SiO_2/SiN/SiO_2$), etc.

Figure 2:
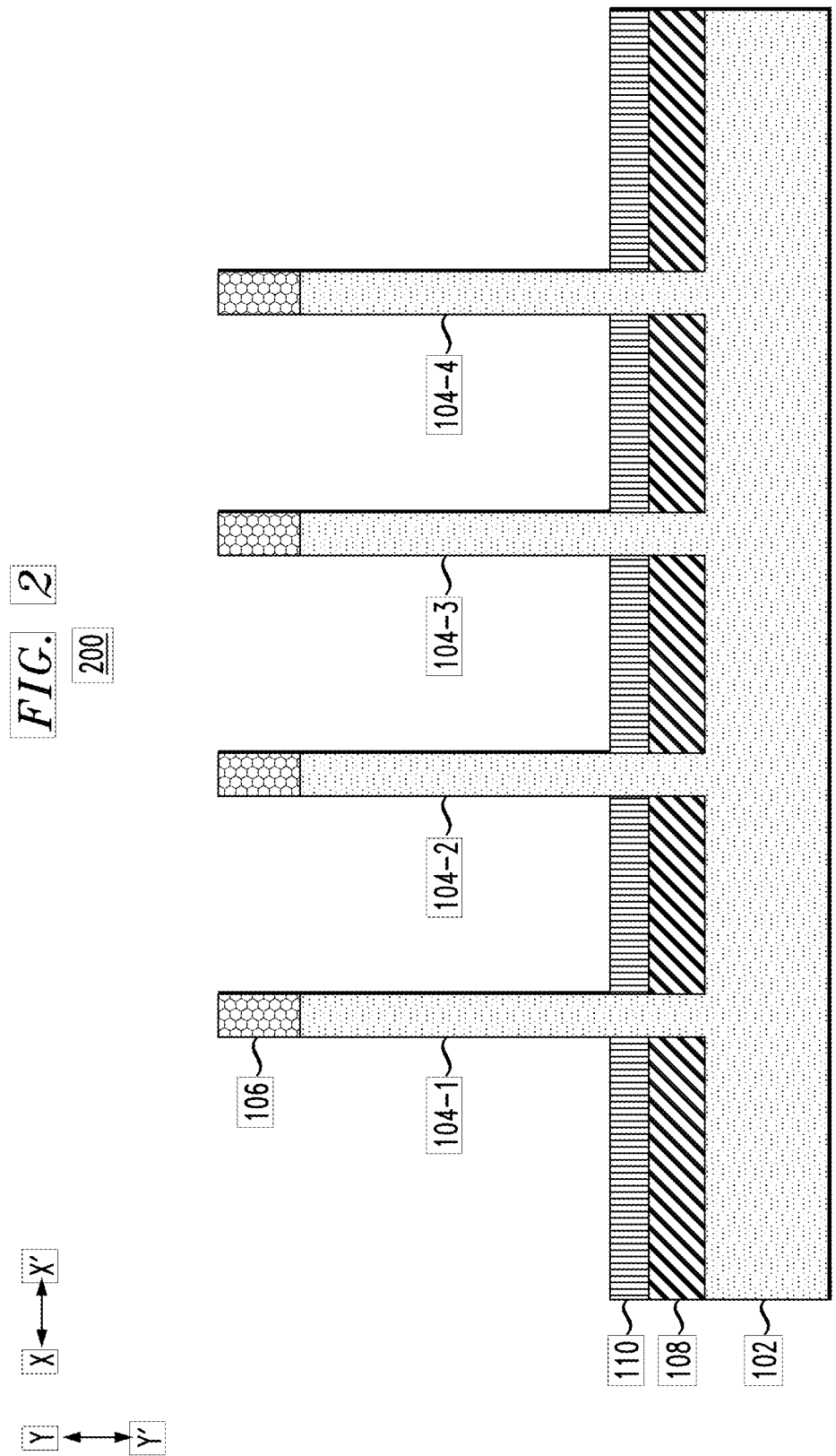
FIG. 2 depicts a cross-sectional view of the FIG. 1 structure following formation of a bottom source/drain region and a bottom spacer, according to an embodiment of the invention.

FIG. 2 shows a cross-sectional view 200 of the FIG. 1 structure following formation of a bottom source/drain region 108 and a bottom spacer 110.

The bottom junction or bottom source/drain region 108 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The bottom source/drain region 108 may be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRP-CVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration in the source/drain can range from $1 \times 10^{19}$ $cm^{-3}$ to $3 \times 10^{21}$ $cm^{-3}$, or preferably between $2 \times 10^{20}$ $cm^{-3}$ to $3 \times 10^{21}$ $cm^{-3}$.

In some embodiments, the bottom source/drain region 108 is Si:P if nFETs are being formed, or SiGe:B if pFETs are being formed. The bottom source/drain region 108 may have a height or vertical thickness (in direction Y-Y') in the range of 20 nm to 50 nm, although other heights above or below this range may be used as desired for a particular application.

The bottom spacer 110 is formed over the bottom source/drain region 108, such as using non-conformal deposition and etch-back processing (e.g., physical vapor deposition (PVD), high density plasma (HDP) deposition, etc.). The bottom spacer 110 may be formed of $SiO_2$, SiN, silicon carbide oxide (SiCO), silicon boron carbide nitride (SiBCN), etc., although other suitable materials may be used. The bottom spacer 110 may have a height or vertical thickness (in direction Y-Y') in the range of 4 nm to 10 nm, although other heights above or below this range may be used as desired for a particular application.

Figure 3:
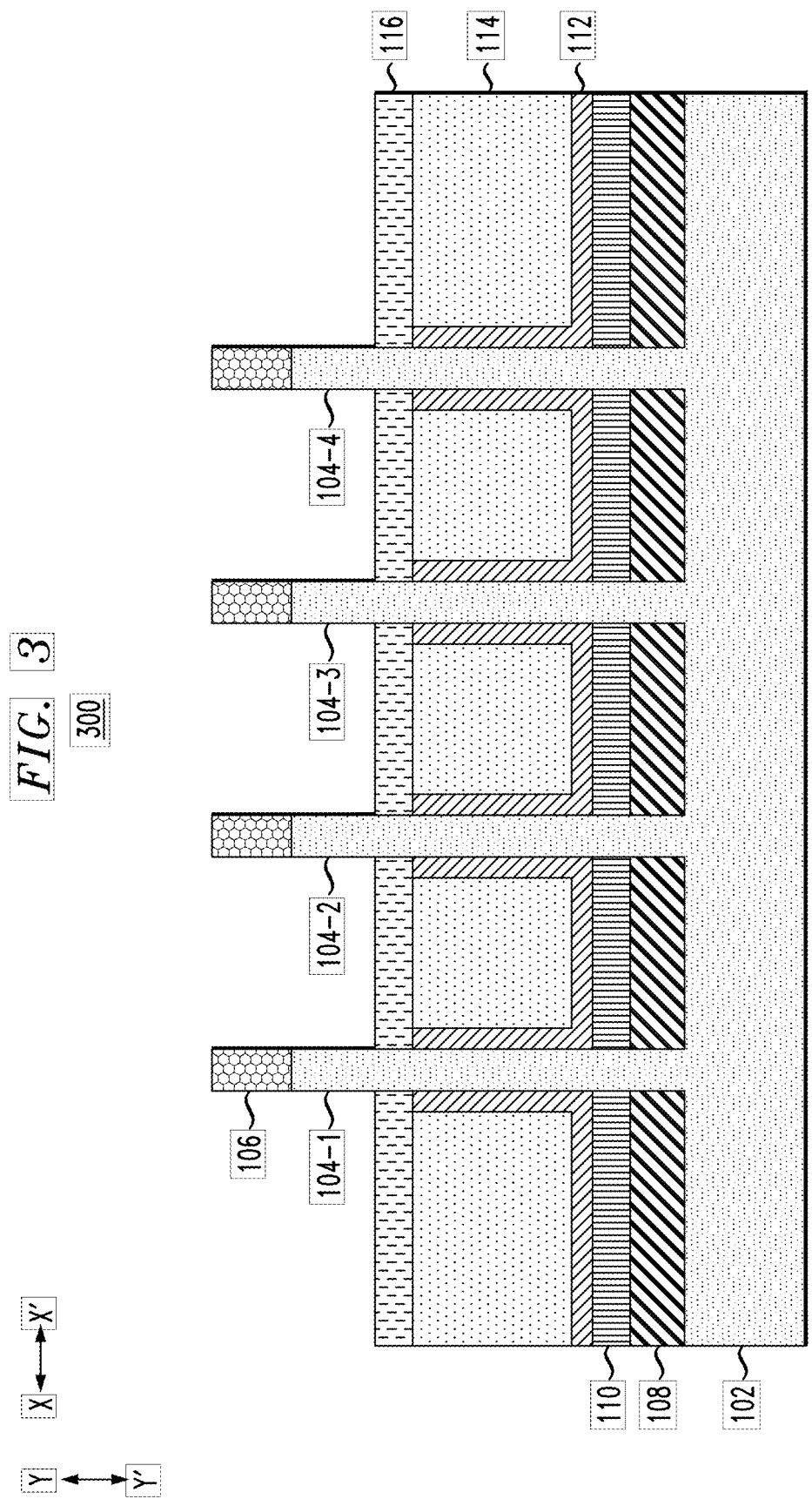
FIG. 3 depicts a cross-sectional view of the FIG. 2 structure following formation of a dummy oxide, a dummy gate, and a top spacer, according to an embodiment of the invention.

FIG. 3 shows a cross-sectional view 300 of the FIG. 2 structure following formation of a dummy oxide 112, a dummy gate 114, and a top spacer 116. The dummy oxide 112 may be formed via blanket deposition and etch back, or other suitable processing. The dummy oxide 112 advantageously protects the material of fins 104 during various downstream processing. The dummy oxide 112 may be formed of $SiO_2$ or another suitable material. The dummy oxide 112 may have a uniform thickness in the range of 2 nm to 5 nm, although other thickness above or below this range may be used as desired for a particular application.

The dummy gate 114 material may initially be deposited to fill the structure, followed by planarization using chemical mechanical planarization (CMP) or another suitable process to stop on the top of the HM 106. The dummy gate 114 material is then recessed below the top surfaces of the fins 104 as illustrated. The dummy gate 114 may be formed of amorphous silicon (a-Si), amorphous silicon germanium (a-SiGe), $SiO_2$, amorphous carbon (a-C), an oxide such as titanium oxide ($TiO_2$), titanium nitride (TiN) or another suitable material. After recess, the dummy gate 114 may have a vertical thickness or height (in direction Y-Y') ranging from 10 nm to 100 nm, although other suitable heights above or below this range may be used as desired so long as the height of the dummy gate 114, after recess, is below the top surface of the fins 104.

The top spacer 116 may be formed by any suitable deposition process. The top spacer 116 may be formed of a nitride such as SiN or another suitable material such as SiBCN, SiOC, silicon carbonitride (SiCN), etc. The top spacer may have a vertical thickness (in direction Y-Y') ranging from 4 nm to 10 nm, although other thicknesses above or below this range may be used as desired for a particular application.

Figure 4:
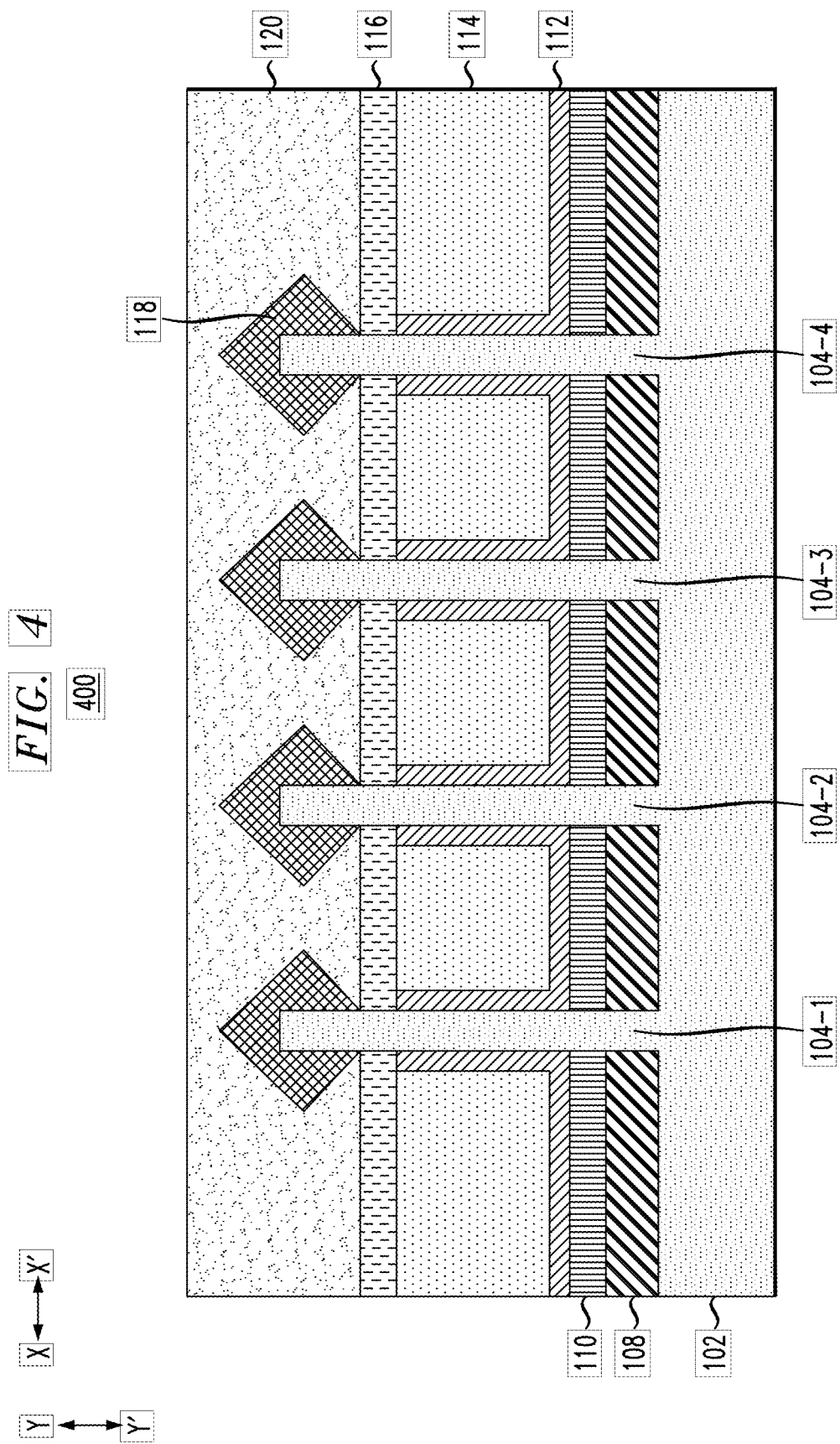
FIG. 4 depicts a cross-sectional view of the FIG. 3 structure following formation of top source/drain regions and an interlayer dielectric, according to an embodiment of the invention.

FIG. 4 shows a cross-sectional view 400 of the FIG. 3 structure following formation of top source/drain regions 118 and an interlayer dielectric (ILD) 120. The top source/drain regions 118 may be formed using processing similar to that described above with respect to formation of the bottom source/drain region 108. In some embodiments, the top source/drain regions 118 are formed of Si:P epitaxial layers for nFETs and of SiGe:B for pFETs. With tight fin pitch, it is possible that the top source/drain regions 118 formed over each of the fins 104 may merge. If the top source/drain regions 118 do merge, however, an additional processing step is used to separate the merged top source/drain regions 118 (e.g., when removing the edge fins as described in further detail below). Although shown in FIG. 4 as having a "diamond" shape, the top source/drain regions 118 in other embodiments may be formed of various other shapes such as a "triangle" or "rectangular" shape, depending on the surface orientation. The top source/drain regions 118 may have a tallest vertical thickness (in direction Y-Y') in the range of 20 nm to 100 nm, and a widest horizontal thickness (in direction X-X') in the range of 20 nm to 100 nm, although other thicknesses outside these ranges may be used as desired for a particular application.

After formation of the top/source drain regions 118, the ILD layer 120 is deposited. The ILD layer 120 may be formed through deposition and planarization using CMP or another suitable technique. The ILD layer 120 may be formed of $SiO_2$ or another suitable material such as SiOC, SiON, etc. The ILD layer 120 may have a vertical thickness (in direction Y-Y') in the range of 40 nm to 200 nm, although other thickness above or below this range may be used as long as the ILD layer 120 fully encapsulates the top source/drain regions 118.

Figure 5:
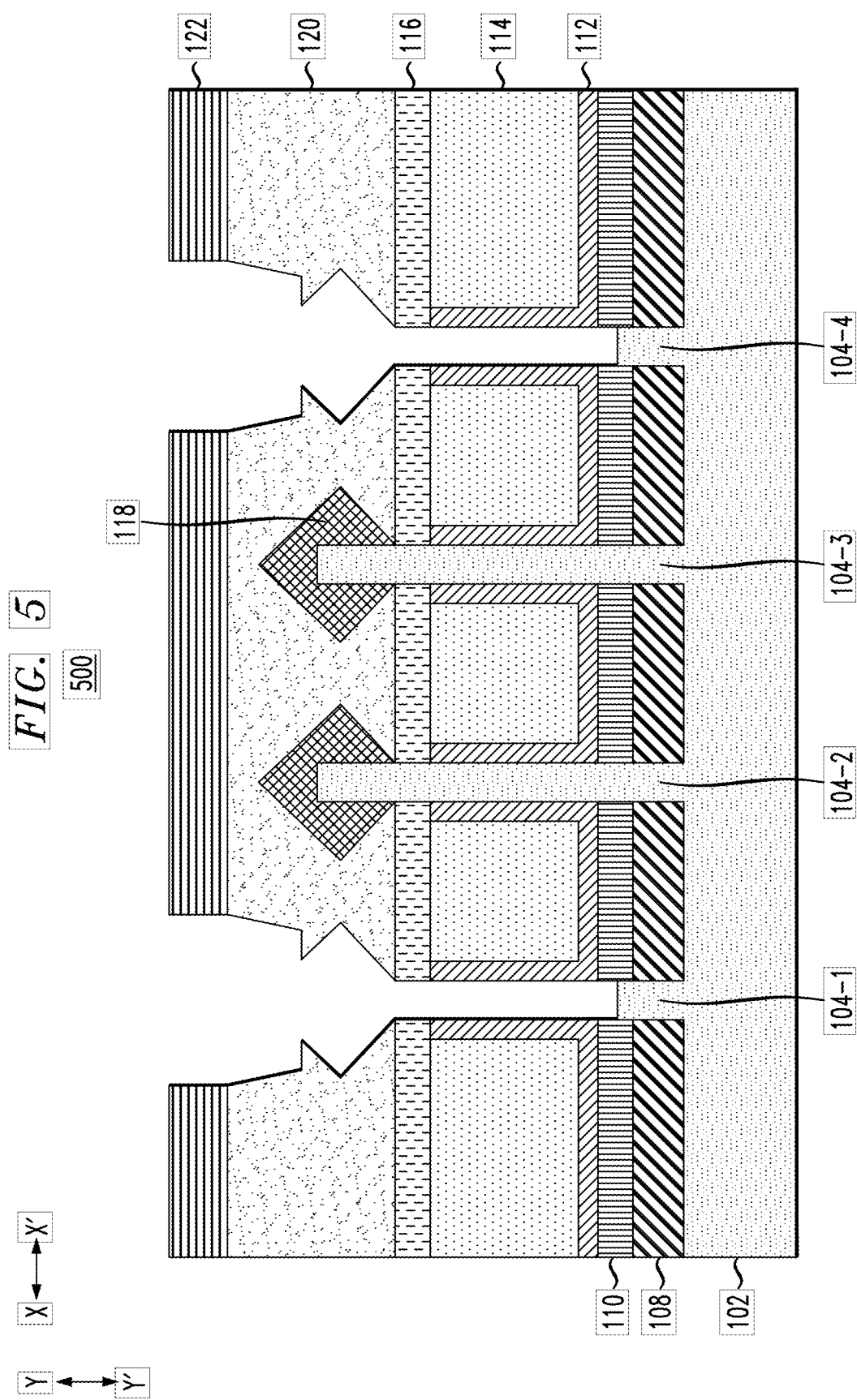
FIG. 5 depicts a cross-sectional view of the FIG. 4 structure following patterning of a mask and removal of portions of the interlayer dielectric, top source/drain regions and the edge fins, according to an embodiment of the invention.

FIG. 5 shows a cross-sectional view 500 of the FIG. 4 structure following patterning of a mask 122 over the ILD layer 120, and following removal of portions of the ILD layer 120, the top source/drain regions 118 and the fins 104 exposed by the mask 122. The mask 122 may be formed of an organic planarization layer (OPL) or another suitable material. The mask 122 is patterned as illustrated to expose the top source/drain regions 118 formed over the "edge" fins 104-1 and 104-4.

The ILD layer 120 is first etched using a dry etch process such as RIE to reveal the top source/drain regions 118 formed over the edge fins 104-1 and 104-4. Next, the top source/drain regions 118 and the edge fins 104-1 and 104-4 are removed using a suitable etch process, such as a dry and/or wet etch chemistry. As the top source/drain regions 118 and fins 104 are formed of semiconductor materials (e.g., Si, SiGe, Ge, group III-V materials, etc.), the top source/drain regions 118 and edge fins 104 can be selectively etched against the ILD layer 120, top spacer 116, dummy oxide 112 and bottom spacer 110 (e.g., which are formed of dielectric materials).

As shown in FIG. 5, the edge fins 104-1 and 104-4 are not completely removed. Instead, the etching stops somewhere in the thickness of the bottom spacer 110. In other words, the remaining portions of the edge fins 104-1 and 104-4 have a top surface above the bottom source/drain region 108 and below the top surface of the bottom spacer 110.

Figure 6:
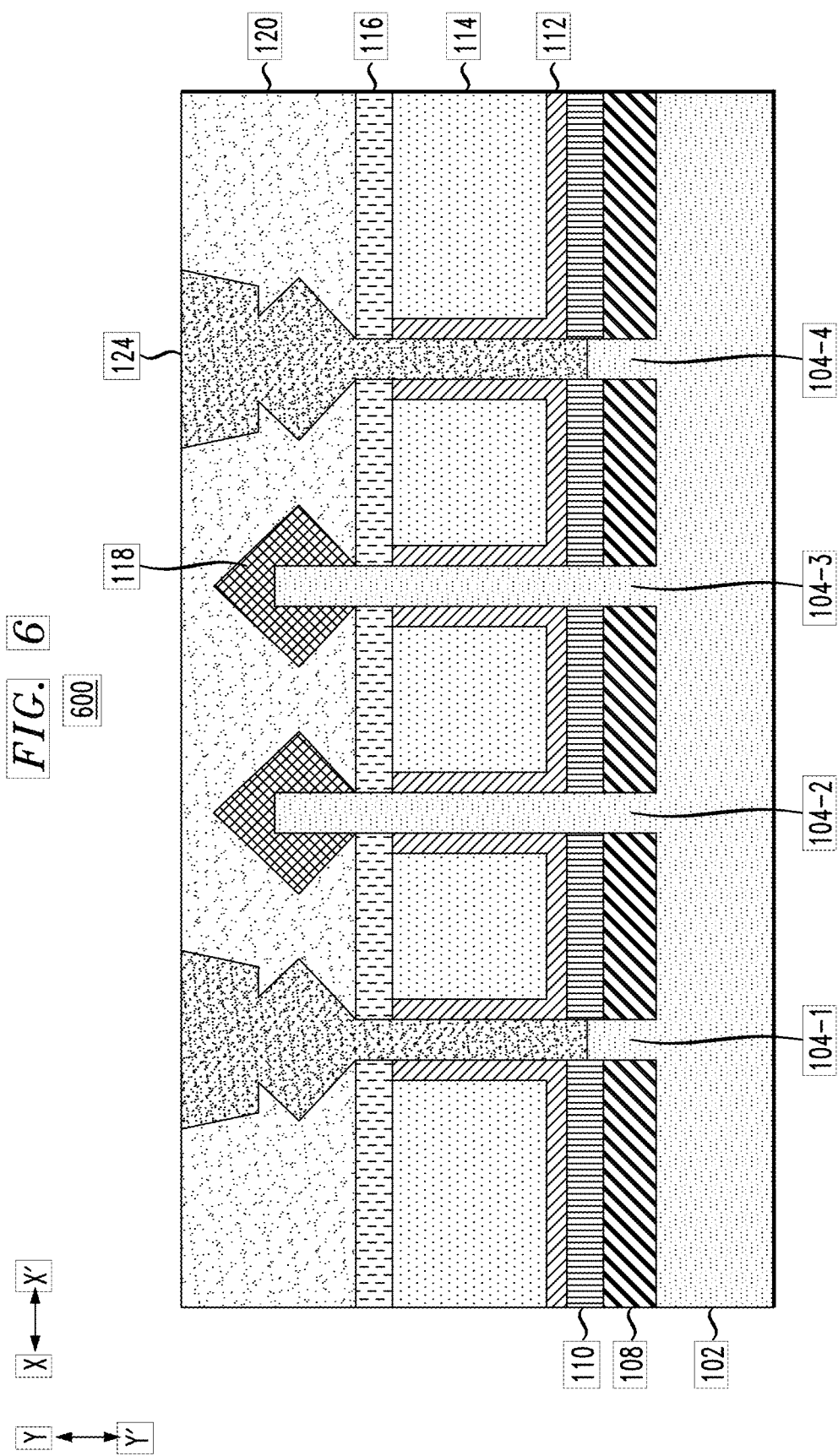
FIG. 6 depicts a cross-sectional view of the FIG. 5 structure following removal of the mask and formation of dielectric material in spaces exposed by removal of the portions of the interlayer dielectric, top source/drain regions, and edge fins, according to an embodiment of the invention.

FIG. 6 shows a cross-sectional view 600 of the FIG. 5 structure following removal of the mask 122 and formation of a dielectric material 124 in spaces exposed by removal of the edge fins 104-1 and 104-4, the top source/drain regions 118 formed over the edge fins 104-1 and 104-4, and the ILD layer 120 above such top source/drain regions 118. The dielectric material 124 may be formed through deposition (e.g., using ALD or another suitable deposition process) followed by planarization with the top surface of the ILD layer 120. The dielectric material 124 may be SiN, SiCO, SiCON, or another suitable dielectric that may be etched selective to the material of the dummy oxide 112 (e.g., amorphous $SiO_2$).

Figure 7:
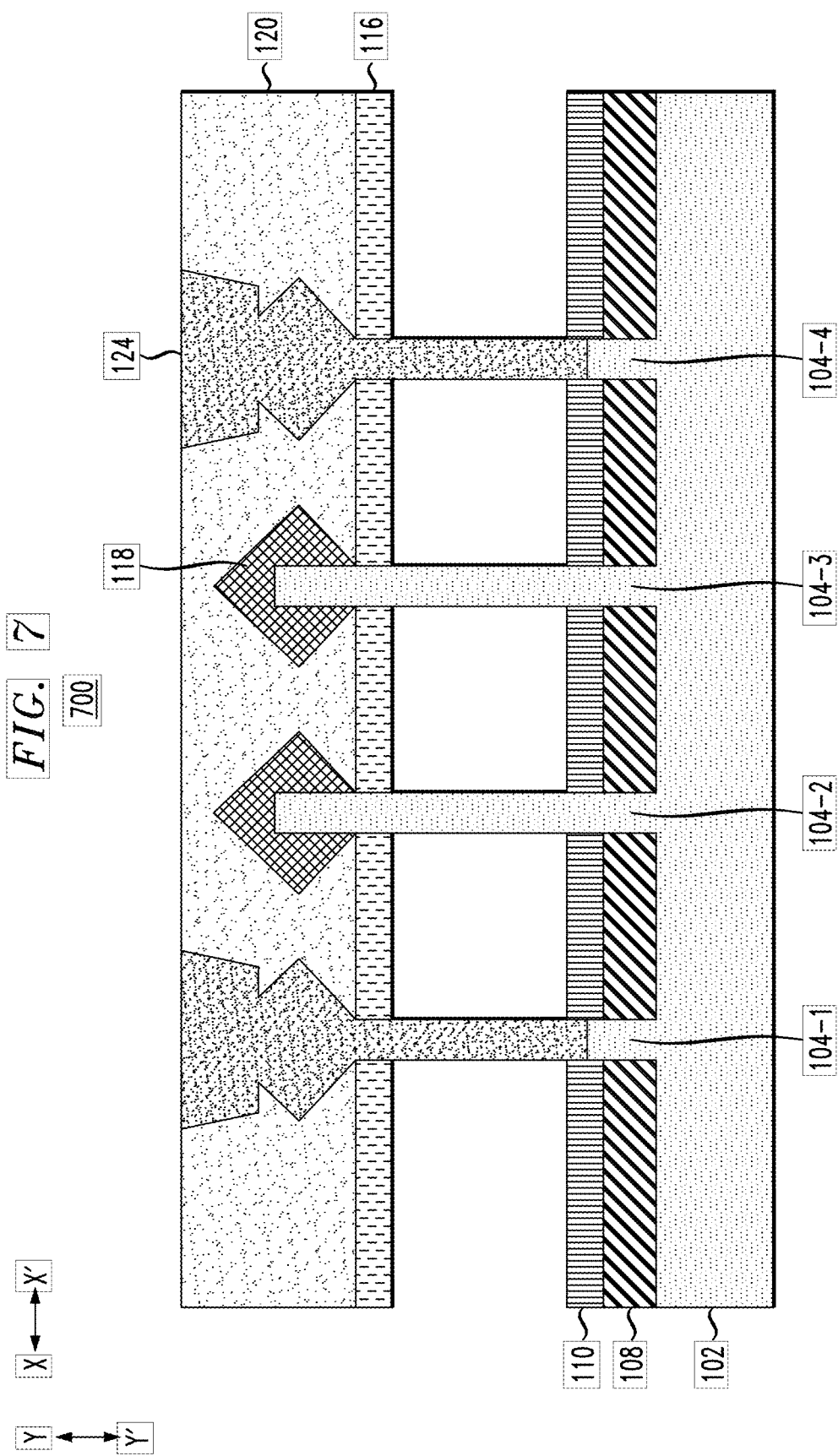
FIG. 7 depicts a cross-sectional view of the FIG. 6 structure following removal of the dummy gate and dummy oxide, according to an embodiment of the invention.

FIG. 7 shows a cross-sectional view 700 of the FIG. 6 structure following removal of the dummy gate 114 and the dummy oxide 112. The dummy gate 114 may be removed using a first etch process (e.g., using an ammonium-type etch), followed by removal of the dummy oxide 112 (e.g., using hydrofluoric acid (HF)).

Figure 8:
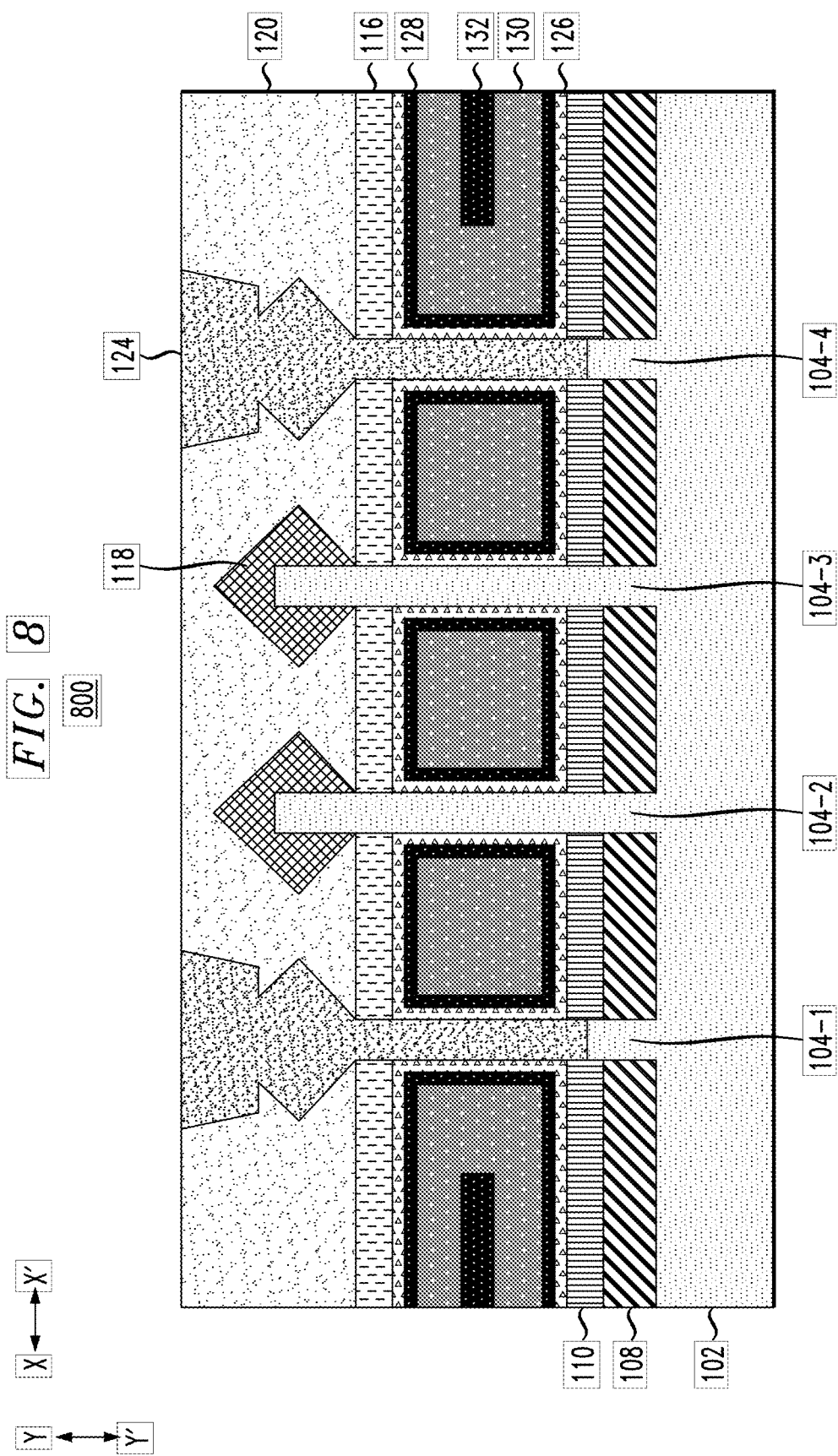
FIG. 8 depicts a cross-sectional view of the FIG. 7 structure following formation of a dielectric layer and metal gate, according to an embodiment of the invention.

FIG. 8 shows a cross-sectional view 800 of the FIG. 7 structure following formation of a dielectric layer 126 and a metal gate stack including layers 128, 130 and 132.

The dielectric layer 126 may be formed of a high-k dielectric material. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The dielectric layer 124 may have a uniform thickness in the range of 1 nm to 3 nm, although other thicknesses above or below this range may be used as desired for a particular application.

The metal gate stack may include a WFM gate stack, with a bottom TiN layer 128, TiAlC layer 130, and top TiN layer 132. Although there is a variation of WFM thickness at the outsides of the edge fins 104-1 and 104-4 (e.g., dielectric fins 124) the edge fins 104-1 and 104-4 are not active devices. There is uniform thickness of the WFM gate stack surrounding the active devices (e.g., the fins 104-2 and 104-3 between the edge dielectric fins 124).

Although the layers 128, 130 and 132 are described above as being formed of TiN/TiAlC/TiN, various other WFM materials may be used for the gate stack. For example, the layers 128 and 132 may be formed of tantalum nitride (TaN) rather than TiN in some embodiments. Further, the layer 130 may be formed of titanium (Ti), aluminum (Al), titanium aluminum (TiAl), or various other combinations of Ti and Al alloys.

The layers 128, 130 and 132 of the gate stack may be formed using ALD deposition or other suitable processes.

As shown in FIG. 8, the spaces between and surrounding the active device fins 104-2 and 104-3 are pinched off with the layer 130. Further, some embodiments assume that the structure beyond the edge dielectric fins 124 has a different width than the fin-to-fin spacing of the active device fins 104.

Figure 9:
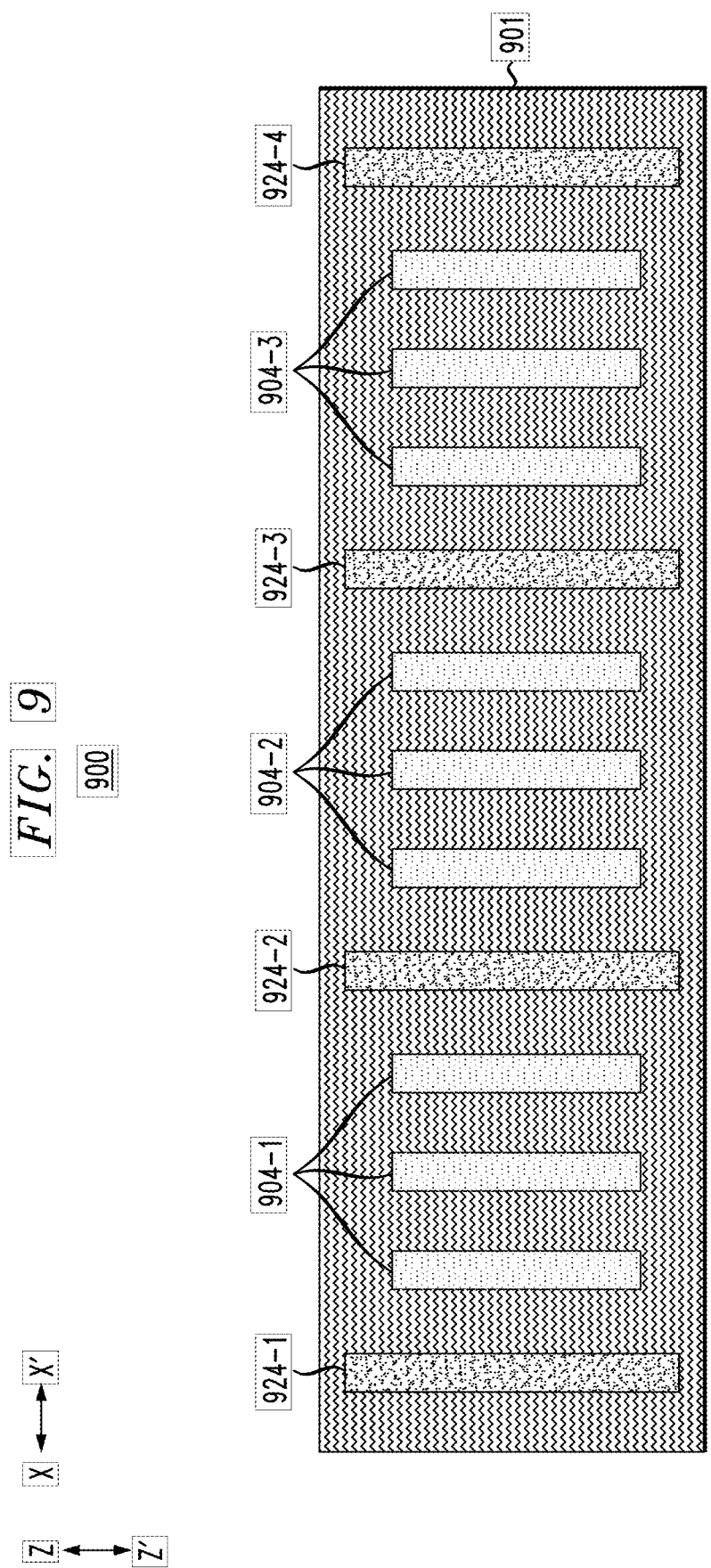
FIG. 9 depicts a top-down view showing isolation of fins in different active regions using dielectric fins, according to an embodiment of the invention.

FIG. 9 shows a top-down view 900 illustrating the isolation of active device fins 904-1, 904-2, and 904-3 (collectively, active device fins 904) in different active regions using dielectric fins 924-1, 924-2, 924-3, and 924-4 (collectively, dielectric fins 924) formed using the processes described herein. The active device fins 904 and dielectric fins 924 are shown surrounded by layer 901, which represents dummy gates.

FIG. 9 shows three active device regions, a first active device region with fins 904-1, a second active device region with fins 904-2, and a third active device region with fins 904-3. Although in this example each of the three active device regions includes the same number of fins (e.g., three fins), embodiments are not so limited. In other embodiments, each active device region may include fewer or greater than three fins. Further, in some embodiments different active device regions may have different numbers of fins. Dielectric or edge fins 924-1, 924-2, 924-3 and 924-4 separate and surround the active region fins 904-1, 904-2 and 904-3.

Figure 10:
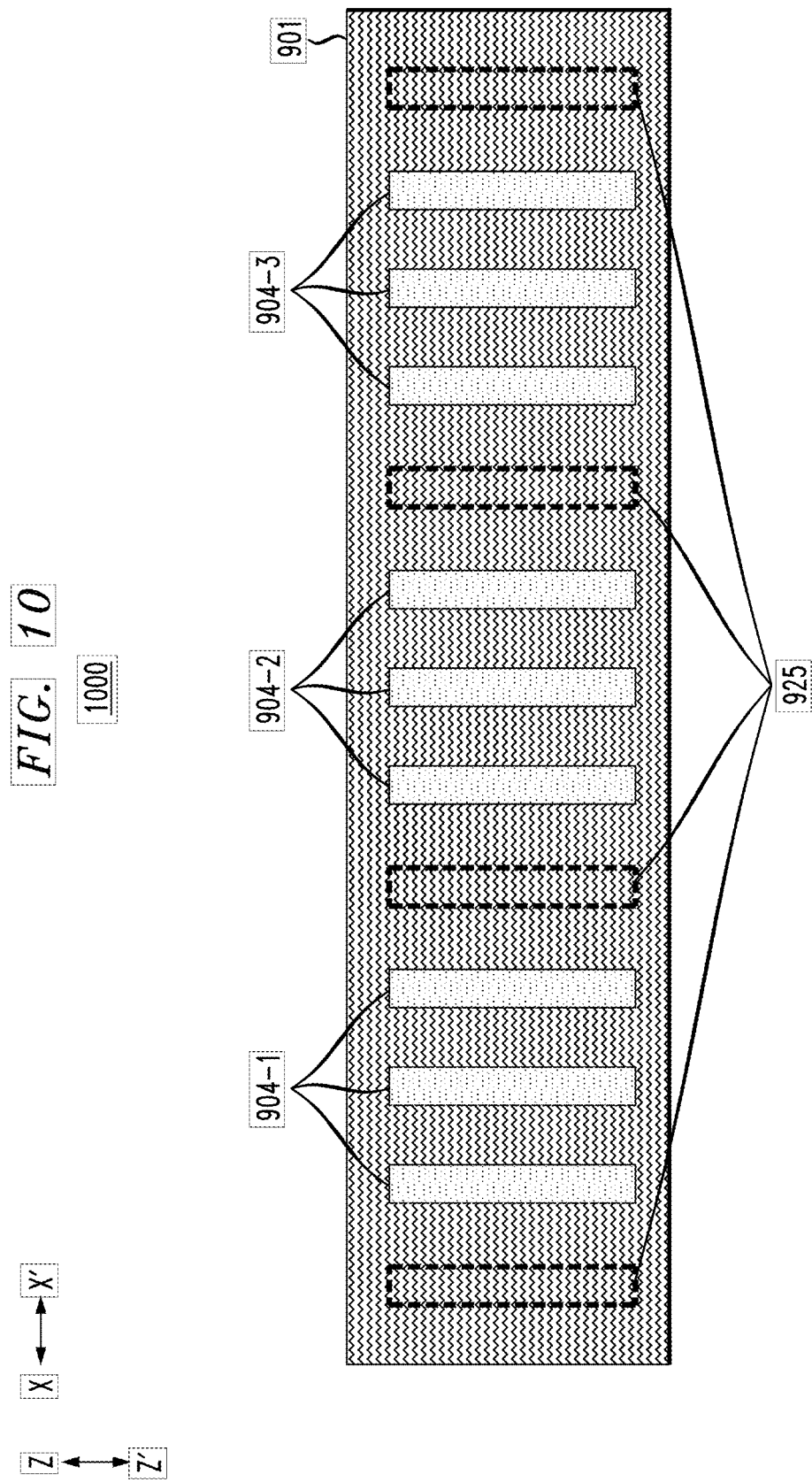
FIG. 10 depicts a top-down view showing single diffusion breaks between the different active regions of FIG. 9, according to an embodiment of the invention.

FIG. 10 shows a top down view 1000 of the FIG. 9 structure, illustrating single diffusion breaks 925 between the active device fins 904-1, 904-2, and 904-3. Thus, some embodiments which have dielectric fins at the edge of active device fin arrays do not have an area penalty in the integrated chip design relative to conventional device designs which have single diffusion breaks for active device isolation.

Figure 11:
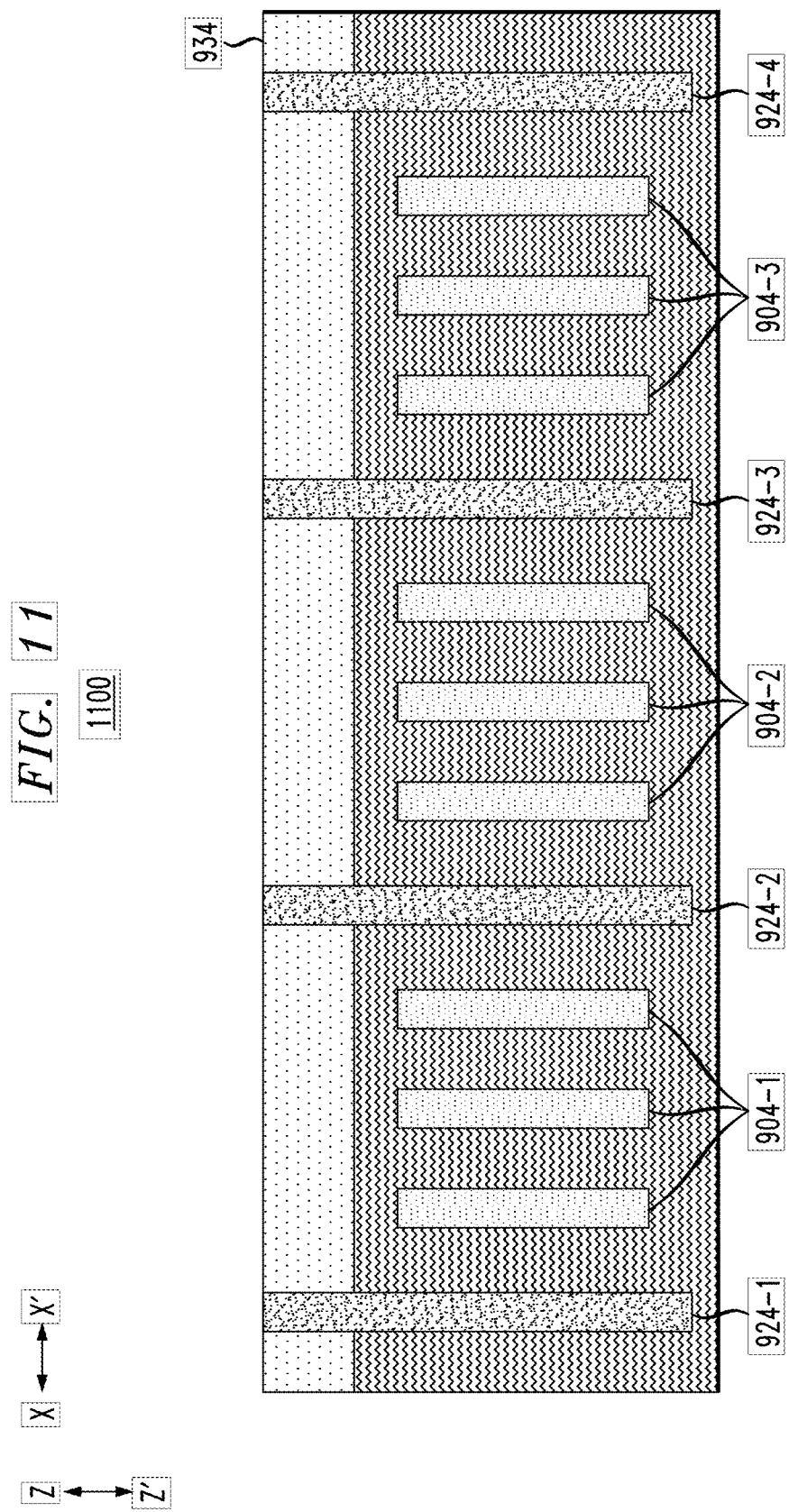
FIG. 11 depicts a top-down view showing dielectric fins having lengths which extend to a shallow trench isolation region to provide isolation between different active regions, according to an embodiment of the invention.

FIG. 11 shows a top-down view 1100 of a structure following formation of the dielectric fins 924 (e.g., following the processing of FIG. 6 described above). As illustrated the mask is patterned longer (in direction Z-Z') than the length of the active device fins 904, to extend into a shallow trench isolation (STI) region 934 as shown. The STI region 934 may be formed of a dielectric material such as $SiO_2$, SiOC, SiON, etc. The STI region 934 isolates the bottom junction or bottom source/drain region (e.g., 108) to provide separate addressability of the different VTFETs of the different active device fins 904-1, 904-2 and 904-3.

Figure 12:
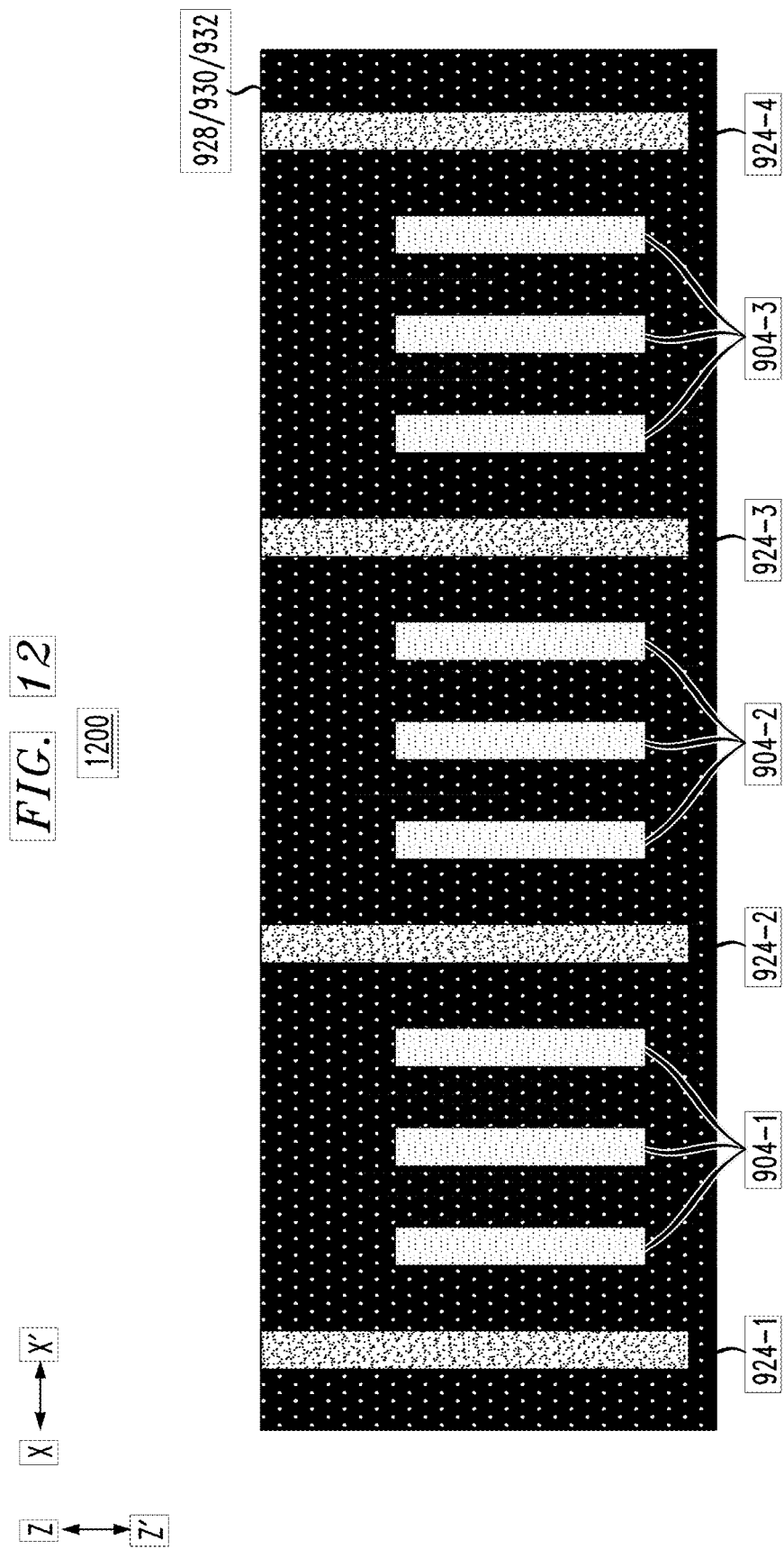
FIG. 12 depicts a top-down view of the FIG. 11 structure following formation of a metal gate, according to an embodiment of the invention.

FIG. 12 shows a top-down view 1200 of the FIG. 11 structure, following formation of the gate stack (e.g., layers 928, 930 and 932 which are similar to the layers 128, 130 and 132 described above). At this point, all the active device fins 904-1, 904-2 and 904-3 are electrically connected by these layers.

Figure 13:
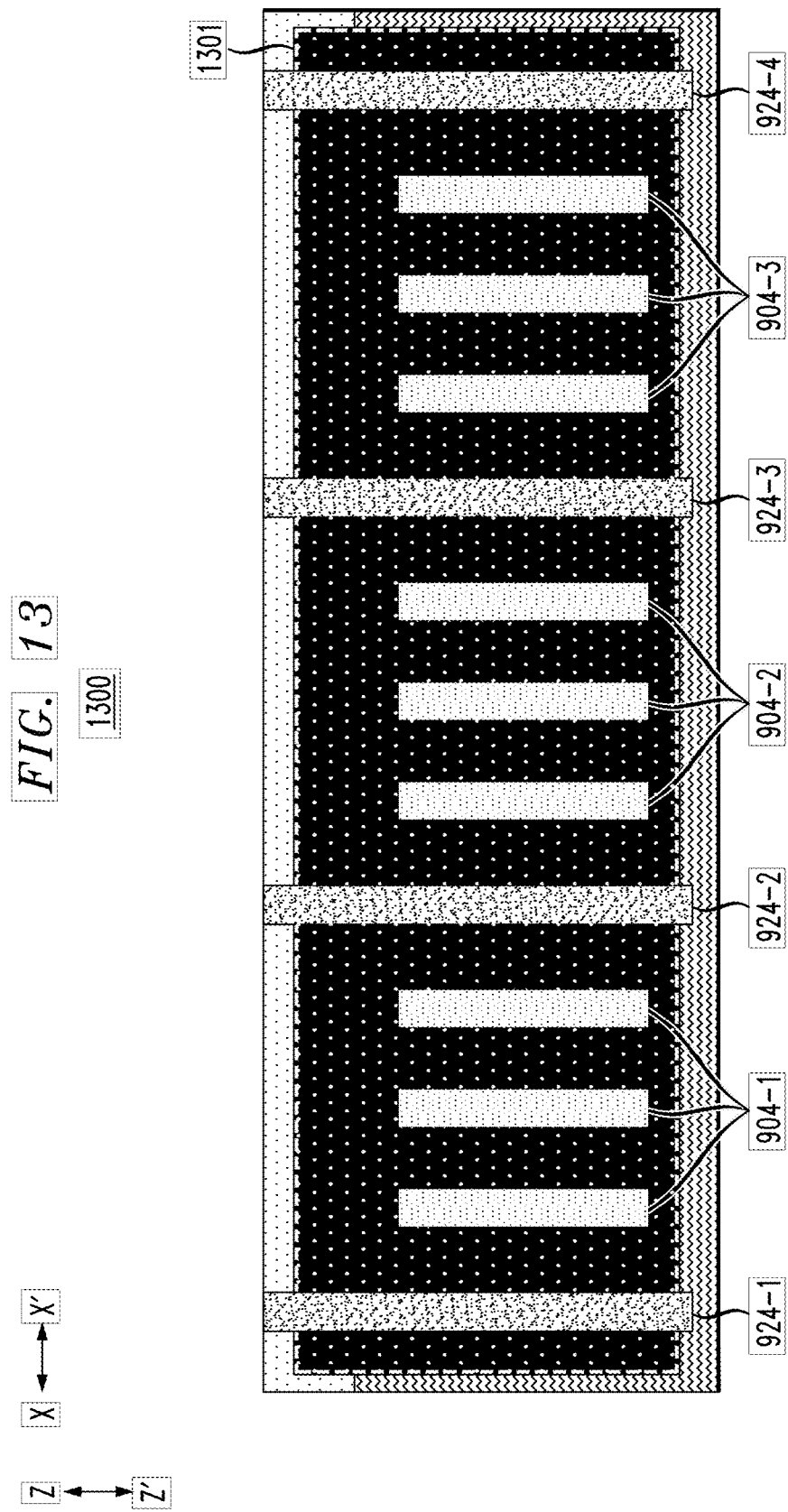
FIG. 13 depicts a top-down view of the FIG. 12 structure showing a gate cut mask to remove portions of the gate material, according to an embodiment of the invention.

FIG. 13 shows a top-down view 1300 of the FIG. 12 structure, following patterning the gate stack (e.g., layers 928, 930 and 932) using a cut mask 1301 as shown. After removal of portions of the gate stack using the cut mask 1301, the active device fins 904-1, 904-2 and 904-3 are isolated from one another.

Figure 14:
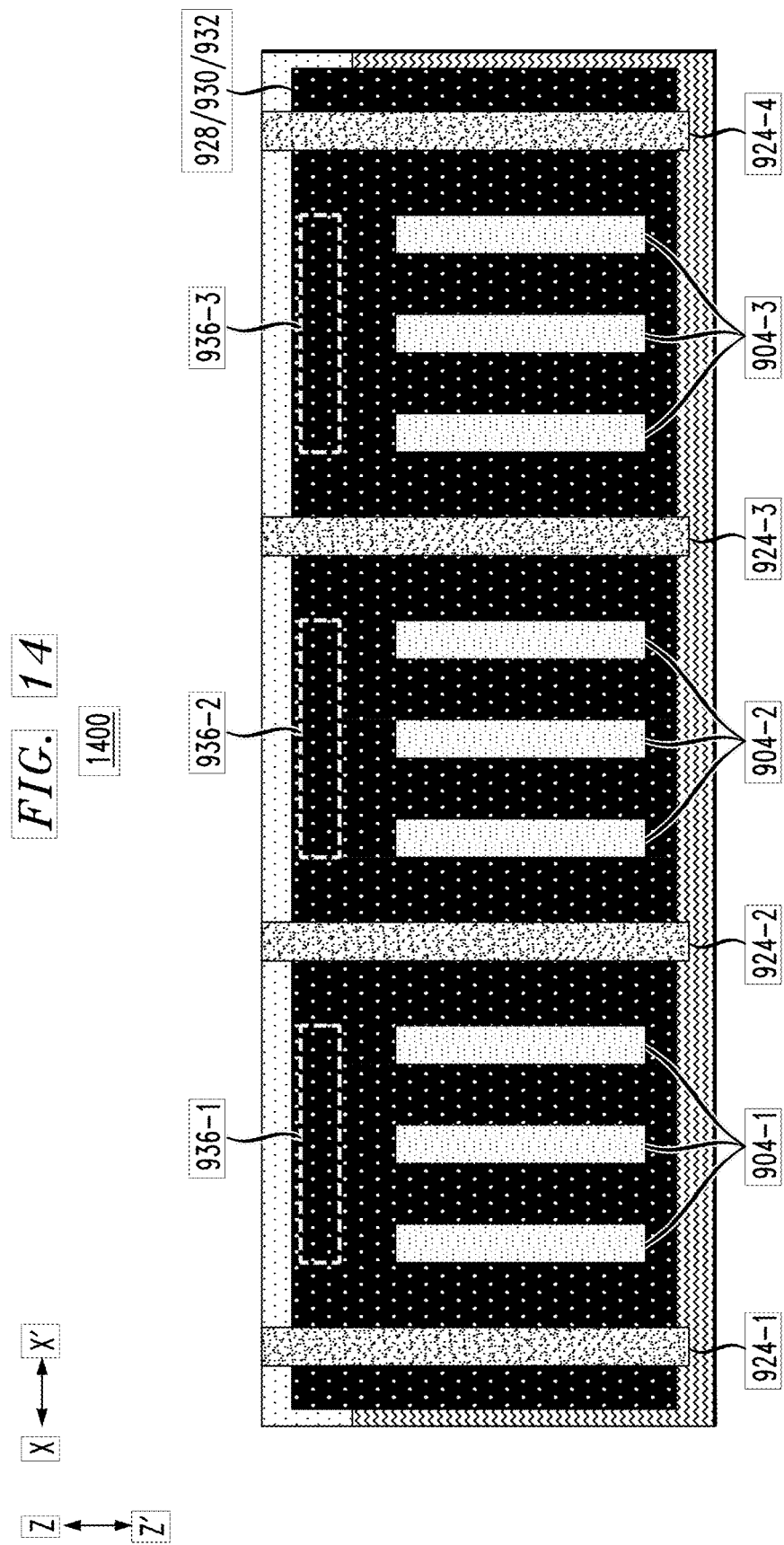
FIG. 14 depicts a top-down view of the FIG. 13 structure following formation of gate contacts, according to an embodiment of the invention.

FIG. 14 shows a top-down view 1400 of the FIG. 13 structure following formation of gate contacts 936-1, 936-2, and 936-3 to the gate stack surrounding the active device fins 904-1, 904-2 and 904-3, respectively. Thus, each VTFET device is isolated from one another.

In some embodiments, a semiconductor structure comprises a substrate, a plurality of fins disposed over a top surface of the substrate, and a gate stack surrounding a portion of sidewalls of the plurality of fins. The plurality of fins comprises two or more active device fins comprising a semiconducting material providing vertical transport channels for respective VTFETs, and two or more edge fins surrounding the two or more active device fins, the two or more edge fins comprising a dielectric material. Thicknesses of one or more layers of the gate stack surrounding the portion of the sidewalls of the two or more edge fins are different than thicknesses of the one or more layers of the gate stack surrounding the portion of the sidewalls of the active device fins.

The one or more layers of the gate stack surrounding the portion of the sidewalls of the two or more active device fins may comprise a first WFM layer and a second WFM layer, and the one or more layers of the gate stack surrounding the portion of the sidewalls of the two or more edge fins may comprise the first WFM layer, the second WFM layer and a third WFM layer. A thickness of the second WFM layer surrounding the portion of the sidewalls of the two or more active device fins is greater than a thickness of the second WFM layer surrounding the portion of the sidewalls of the two or more edge fins. The first WFM layer and the third WFM layer may comprise one of TaN and TiN, and the second WFM layer may comprise an aluminum-containing tantalum or titanium alloy. The aluminum-containing tantalum or titanium alloy may comprise TiAlC.

The dielectric material may comprise a nitride, such as SiN.

The semiconductor structure may further comprise a bottom source/drain region disposed over the top surface of the substrate and surrounding a portion of the sidewalls of the plurality of fins adjacent the top surface of the substrate, a bottom spacer disposed over the bottom source/drain region and surrounding a portion of the sidewalls of the plurality of fins adjacent a top surface of the bottom source/drain region, top source/drain regions disposed over tops of the two or more active device fins, and a top spacer surrounding a portion of the sidewalls of the plurality of fins disposed proximate the tops of the plurality of fins. The semiconductor structure may further comprise a dielectric layer disposed between: (i) the gate stack; and (ii) a top surface of the bottom spacer, a bottom surface of the top spacer, and portions of the sidewalls of the plurality of fins disposed between the bottom spacer and the top spacer.

The VTFETs of the active device fins may have uniform threshold voltage.

The two or more active device fins may have a fin pitch between 10 and 30 nm.

In some embodiments, an integrated circuit comprises two or more VTFETs comprising a substrate, a plurality of fins disposed over a top surface of the substrate, and a gate stack surrounding a portion of sidewalls of the plurality of fins. The plurality of fins comprises two or more active device fins comprising a semiconducting material providing vertical transport channels for respective ones of the two or more VTFETs, and two or more edge fins surrounding the two or more active device fins, the two or more edge fins comprising a dielectric material. Thicknesses of one or more layers of the gate stack surrounding the portion of the sidewalls of the two or more edge fins are different than thicknesses of the one or more layers of the gate stack surrounding the portion of the sidewalls of the active device fins.

The one or more layers of the gate stack surrounding the portion of the sidewalls of the two or more active device fins may comprise a first layer and a second WFM layer, and the one or more layers of the gate stack surrounding the portion of the sidewalls of the two or more edge fins may comprise the first WFM layer, the second WFM layer and a third WFM layer.

In some embodiments, a method of forming a semiconductor structure comprises forming a plurality of fins disposed over a top surface of a substrate, the plurality of fins comprising two or more edge fins surrounding two or more interior fins, the plurality of fins comprising a semiconducting material, replacing the semiconducting material of the two or more edge fins with a dielectric material, and forming a gate stack surrounding a portion of sidewalls of the plurality of fins. The two or more interior fins comprise active device fins providing vertical transport channels for respective ones of two or more VTFETs. Thicknesses of one or more layers of the gate stack surrounding the portion of the sidewalls of the two or more edge fins are different than thicknesses of the one or more layers of the gate stack surrounding the portion of the sidewalls of the active device fins.

Forming the plurality of fins comprises patterning a hard mask over the substrate, and removing portions of the substrate exposed by the hard mask. The method may further comprise forming a bottom source/drain region disposed over a top surface of the substrate surrounding a bottom portion of the sidewalls of the plurality of fins, forming a bottom spacer disposed over a top surface of the bottom source/drain region surrounding a portion of the sidewalls of the plurality of fins, forming a dummy oxide layer over the plurality of fins and the bottom spacer, forming a dummy gate layer over the dummy oxide layer, recessing the dummy oxide layer and the dummy gate layer below a bottom surface of the hard mask to expose a portion of the sidewalls of the plurality of fins, and forming a top spacer disposed over the dummy oxide layer and the dummy gate layer surrounding a portion of the sidewalls of the plurality of fins.

The method may further comprise removing the hard mask disposed over top surfaces of the plurality of fins, forming top source/drain regions disposed over the top surfaces of the plurality of fins, forming an interlayer dielectric disposed over the top spacer and surrounding the top source/drain regions, patterning a mask disposed over a top surface of the interlayer dielectric to form openings disposed over top surfaces of the two or more edge fins, removing portions of the interlayer dielectric exposed by the openings in the patterned mask, removing the top source/drain regions disposed over top surfaces of the edge fins, and removing at least a portion of the two or more edge fins, a remaining portion of the two or more edge fins having a top surface disposed between a bottom surface of the bottom spacer and a top surface of the bottom spacer.

The method may further comprise removing the dummy gate layer, removing the dummy oxide layer, forming a dielectric layer, and forming the gate stack disposed over the dielectric layer. Forming the gate stack disposed over the dielectric layer may comprise forming a first WFM layer disposed over the dielectric layer, forming a second WFM layer disposed over the first WFM layer, and forming a third WFM layer. The first WFM layer and the second WFM layer surround the two or more active device fins, and the first WFM layer, the second WFM layer and the third WFM layer are formed surrounding first sides of the two or more edge fins opposite the two or more active device fins. A thickness of the second WFM layer surrounding the portion of the sidewalls of the two or more active device fins is greater than a thickness of the second WFM layer surrounding the portion of the sidewalls of the two or more edge fins.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a plurality of fins disposed over a top surface of a substrate, the plurality of fins comprising two or more edge fins surrounding two or more interior fins, the plurality of fins comprising a semiconducting material;
    replacing the semiconducting material of the two or more edge fins with a dielectric material;
    forming a gate stack surrounding a portion of sidewalls of the plurality of fins;
    wherein the two or more interior fins comprise active device fins providing vertical transport channels for respective ones of two or more vertical transport field-effect transistors;
    wherein thicknesses of one or more layers of the gate stack surrounding the portion of the sidewalls of the two or more edge fins are different than thicknesses of the one or more layers of the gate stack surrounding the portion of the sidewalls of the active device fins; and
    wherein forming the plurality of fins comprises patterning a hard mask over the substrate, and removing portions of the substrate exposed by the hard mask;
    forming a bottom source/drain region disposed over a top surface of the substrate surrounding a bottom portion of the sidewalls of the plurality of fins;
    forming a bottom spacer disposed over a top surface of the bottom source/drain region surrounding a portion of the sidewalls of the plurality of fins;
    forming a dummy oxide layer over the plurality of fins and the bottom spacer;
    forming a dummy gate layer over the dummy oxide layer;
    recessing the dummy oxide layer and the dummy gate layer below a bottom surface of the hard mask to expose a portion of the sidewalls of the plurality of fins;
    forming a top spacer disposed over the dummy oxide layer and the dummy gate layer surrounding a portion of the sidewalls of the plurality of fins;
    removing the hard mask disposed over top surfaces of the plurality of fins;
    forming top source/drain regions disposed over the top surfaces of the plurality of fins;
    forming an interlayer dielectric disposed over the top spacer and surrounding the top source/drain regions;
    patterning a mask disposed over a top surface of the interlayer dielectric to form openings disposed over top surfaces of the two or more edge fins;
    removing portions of the interlayer dielectric exposed by the openings in the patterned mask;

removing the top source/drain regions disposed over top surfaces of the edge fins; and removing at least a portion of the two or more edge fins, a remaining portion of the two or more edge fins having a top surface disposed between a bottom surface of the bottom spacer and a top surface of the bottom spacer.

2. The method of claim 1, further comprising:

removing the dummy gate layer;

removing the dummy oxide layer;

forming a dielectric layer; and forming the gate stack disposed over the dielectric layer.

3. The method of claim 2, wherein forming the gate stack disposed over the dielectric layer comprises:

forming a first work function metal (WFM) layer disposed over the dielectric layer;

forming a second WFM layer disposed over the first WFM layer; and forming a third WFM layer;

wherein the first WFM layer and the second WFM layer surround the two or more active device fins, and wherein the first WFM layer, the second WFM layer and the third WFM layer are formed surrounding first sides of the two or more edge fins opposite the two or more active device fins.

4. The method of claim 3, wherein a thickness of the second WFM layer surrounding the portion of the sidewalls of the two or more active device fins is greater than a thickness of the second WFM layer surrounding the portion of the sidewalls of the two or more edge fins.

5. The method of claim 1, wherein the one or more layers of the gate stack surrounding the portion of the sidewalls of the two or more active device fins comprise a first work function metal (WFM) layer and a second WFM layer, and wherein the one or more layers of the gate stack surrounding the portion of the sidewalls of the two or more edge fins comprise the first WFM layer, the second WFM layer and a third WFM layer.

6. The method of claim 5, wherein a thickness of the second WFM layer surrounding the portion of the sidewalls of the two or more active device fins is greater than a thickness of the second WFM layer surrounding the portion of the sidewalls of the two or more edge fins.

7. The method of claim 6, wherein the first WFM layer and the third WFM layer comprise one of tantalum nitride (TaN) and titanium nitride (TiN), and wherein the second WFM layer comprises an aluminum-containing tantalum or titanium alloy.

8. The method of claim 7, wherein the aluminum-containing tantalum or titanium alloy comprises titanium aluminum carbide (TiAlC).

9. The method of claim 7, wherein the aluminum containing tantalum or titanium alloy comprises titanium aluminum (TiAl).

10. The method of claim 1, wherein the dielectric material comprises a nitride.

11. The method of claim 10, wherein the nitride comprises silicon nitride (SiN).

12. The method of claim 1, wherein the vertical transport field-effect transistors have a uniform threshold voltage.

13. The method of claim 1, wherein the two or more active device fins comprise a fin pitch between 10 and 30 nanometers (nm).

* * * * *